(12) United States Patent
Yoo et al.

(10) Patent No.: US 6,770,920 B2
(45) Date of Patent: Aug. 3, 2004

(54) NONVOLATILE MEMORY DEVICES

(75) Inventors: Tae-Kwang Yoo, Yongin-shi (KR); Jeong-Uk Han, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/334,952

(22) Filed: Dec. 31, 2002

(65) Prior Publication Data

US 2003/0127683 A1 Jul. 10, 2003

(30) Foreign Application Priority Data

Jan. 4, 2002 (KR) ........................................ 2002-00451

(51) Int. Cl.$^7$ ............................................ H01L 27/148
(52) U.S. Cl. ...................... 257/228; 257/314; 257/316; 257/326
(58) Field of Search .............................. 257/228, 314, 257/315, 316, 317, 321, 326; 438/257, 258, 264

(56) References Cited

U.S. PATENT DOCUMENTS 6,127,224 A * 10/2000 Pio ............................. 438/258
6,221,716 B1 * 4/2001 Lee et al. .................... 438/257
6,465,307 B1 * 10/2002 Chidambaram et al. ..... 438/286
6,479,347 B1 * 11/2002 Dalla Libera et al. ....... 438/258
2003/0127684 A1 * 7/2003 Yoo et al. .................... 257/316

* cited by examiner

*Primary Examiner*—Tuan H. Nguyen
(74) *Attorney, Agent, or Firm*—Mills & Onello, LLP

(57) ABSTRACT

Nonvolatile memory devices and methods for fabricating the same are provided. The device includes first and second base patterns disposed under floating and selection gates, respectively, at an active region. A channel region is formed in the active region between the first and second base patterns, and source and drain regions are formed in the active region adjacent to the first and second base patterns, respectively. The method includes forming first and second base patterns on a semiconductor substrate to be separated from each other by a predetermined space. A channel region is formed in the semiconductor substrate between the first and second base patterns. Source and drain regions are formed in the semiconductor substrate adjacent to the reverse side of the channel region on the basis of the first and second base patterns, respectively. A tunnel oxide layer is formed on a predetermined region of the channel region. A memory gate is formed to cover the first base pattern and the tunnel oxide layer. A selection gate pattern is then formed to cover the second base pattern.

16 Claims, 17 Drawing Sheets

NONVOLATILE MEMORY DEVICES

RELATED APPLICATION

This application relies for priority upon Korean Patent Application No. 2002-00451, filed on Jan. 4, 2002, the contents of which are herein incorporated by reference in their entirety.

FIELD OF THE INVENTION

The present invention relates to nonvolatile memory devices and methods for fabricating the same. More specifically, the present invention is directed to electrically erasable programmable read-only memories (EEPROMs) of a floating gate tunnel oxide (FLOTOX) type in which memory transistors and selection transistors are connected in series, and methods for fabricating the same.

BACKGROUND OF THE INVENTION

Like erasable programmable read only memory (EPROM) cells, EEPROM cells include floating gates and store data by injecting electrons into the floating gate or erase data by emitting the electrons from the floating gate. However, EEPROMs adopt a manner of injecting or emitting electrons, which is quite different from EPROMs.

In EPROMs, electrons are injected into a floating gate by hot carrier injection (HCI) and emitted from the floating gate by energy of ultraviolet rays irradiated to the floating gate. By comparison, EEPROMs employ tunneling induced by a thin tunnel insulation layer for injecting and emitting electrons. That is, if a strong electric field of about 10 MeV/cm is applied to both surfaces of the tunnel insulation layer, a current flows through the tunnel insulation layer, which is normally called "Fowler-Nordheim (F-N) tunneling". In the EEPROMs, the F-N tunneling is used for injecting and emitting electrons.

In the case of the EEPROMs such as FLOTOX-type memories, a single memory cell includes a pair of transistors, which are connected in a series. One is a selection transistor for selecting cells, and the other is a memory transistor for storing data. The memory transistor includes a floating gate for storing electric charge, a control gate electrode for controlling a memory transistor, and a gate interlayer dielectric layer interposed therebetween.

FIGS. 1 through 3 are cross-sectional views for illustrating a method of fabricating a conventional nonvolatile memory device.

Referring to FIG. 1, a gate insulation layer 102 is formed on a semiconductor substrate 100, and a channel diffusion layer 110 is formed in a predetermined region of the semiconductor substrate 100. Although not shown in the drawings, before forming the gate insulation layer 102, a device isolation layer is formed at a predetermined region of the semiconductor substrate to define an active region. The gate insulation layer 102 is formed on the active region. A portion of the gate insulation layer 102 is removed to expose a predetermined region of the channel diffusion layer 110. A tunnel insulation layer 118 is formed on the exposed region. That is, the tunnel insulation layer 118 is disposed on the channel diffusion layer 110. A lower conductive layer and a dielectric layer are sequentially formed on an entire surface of the semiconductor substrate 100. Thereafter, the lower conductive layer and the dielectric layer are successively patterned to form a floating gate pattern 120a covering the channel diffusion layer 110, and a lower selection gate pattern 120b separated from the floating gate pattern 120a by a predetermined space. A gate interlayer dielectric layer 122a is formed on the floating gate pattern 120a, and an interlayer dielectric pattern 122b is formed on the lower selection gate pattern 120b.

Referring to FIG. 2, a thermal process is performed on the resultant structure to form a sidewall insulation layer 124 on sidewalls of the floating gate pattern 120a and the lower selection gate pattern 120b. An upper conductive layer 126 is formed on an entire surface of the resultant structure where the sidewall insulation layer 124 is formed.

Referring to FIG. 3, the upper conductive layer 126 is patterned to form a control gate electrode 126a on the gate interlayer dielectric layer 122a and at the same time form an upper selection gate 126b on the interlayer dielectric pattern 122b.

Although not shown in the drawings, in another method, after forming the lower conductive layer, the upper conductive layer, the dielectric layer, and the lower conductive layer may be successively patterned to form a control gate electrode as well as a gate interlayer dielectric pattern and a floating gate pattern, which are self-aligned to the control gate electrode. At the same time, an upper selection gate as well as an interlayer dielectric pattern and a lower selection gate pattern, which are self-aligned to the upper selection gate, may be formed.

The floating gate pattern 120a, the gate interlayer dielectric layer 122a, and the control gate electrode 126a constitute a gate pattern of the memory transistor. The lower selection gate pattern 120b, the interlayer dielectric pattern 122b, and the upper selection gate 126b constitute a gate pattern of the selection transistor.

Next, impurities are injected into the semiconductor substrate between the memory gate pattern and the selection gate pattern to form a channel region 110a including the channel diffusion layer 110. A source region 108 is formed in the semiconductor substrate adjacent to the memory gate pattern. A drain region 112 is formed in the semiconductor substrate adjacent to the selection gate pattern.

FIG. 4 is a cross-sectional view for illustrating disadvantages of the conventional nonvolatile memory device. Referring to FIG. 4, a cell array of the nonvolatile memory device of FLOTOX type includes memory cells, each of which has a selection transistor and a memory transistor. In the foregoing cell array, adjacent memory cells are disposed symmetrically with respect to each other. That is, each memory cell has a source region in common with a memory cell adjacent to one side thereof, and has a drain region in common with a memory cell adjacent to the other side thereof. Accordingly, when the floating gate pattern 120a and the lower selection gate pattern 120b are formed to be misaligned, spaces between the source regions 108 and the channel regions 110a become irregular. This may cause dispersion of threshold voltages of memory transistors to be increased.

SUMMARY OF THE INVENTION

It is therefore an object of the present invention to provide nonvolatile memory devices, of which memory cells include channel regions and source regions that have regular spaces therebetween, and methods of fabricating the same.

It is another object of the present invention to provide nonvolatile memory devices, of which cell arrays include memory transistors having threshold voltages of low dispersion, and methods of fabricating the same.

In accordance with objects of the present invention, provided is a nonvolatile memory device, which in one embodiment is of FLOTOX type, and in which a memory transistor and a selection transistor are connected in a series. The device comprises first and second base patterns, which are disposed on a semiconductor substrate to be separated from each other by a predetermined space, and a channel region formed in the semiconductor substrate between the first and second base patterns. Source and drain regions, which are separated from the channel region by the first and second base patterns, are disposed in the semiconductor substrate adjacent to the first and second base patterns, respectively. A memory-gate covers the first base pattern and is extended to a predetermined region of the channel region. A tunnel insulation layer is interposed between the memory gate and the channel region. The selection gate covers the second base pattern.

In a first embodiment of the present invention, the memory gate may include a floating gate pattern covering the first base pattern and a predetermined region of the channel region, and a control gate electrode covering the floating gate pattern. A gate interlayer dielectric layer is interposed between the control gate electrode and the floating gate pattern. In addition, the selection gate may comprise a lower selection gate pattern, an interlayer dielectric layer and an upper selection gate, which are sequentially stacked on the second base pattern. In this case, the upper selection gate and the lower selection gate pattern are connected to each other, penetrating the interlayer dielectric layer.

The method of fabricating the nonvolatile memory device comprises forming first and second base patterns, which are separated from each other by a predetermined space on a semiconductor substrate. A channel region is formed in the semiconductor substrate between the first and second base patterns. Source and drain regions, which are separated from the channel region by the first and second base patterns, are formed in the active regions adjacent to the first and second base patterns, respectively. A tunnel oxide layer is formed on a predetermined region of the channel region, and a memory gate is formed to cover the first base pattern and the tunnel oxide layer. In addition, a selection gate pattern is formed to cover the second base pattern. The memory gate includes a floating gate pattern, a gate interlayer dielectric layer, and a control gate electrode, which are sequentially stacked. The floating gate pattern covers the first base pattern and the tunnel oxide layer, and the control gate electrode is disposed on the floating gate. The gate interlayer dielectric layer is interposed between the control gate electrode and the floating gate pattern.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 1:
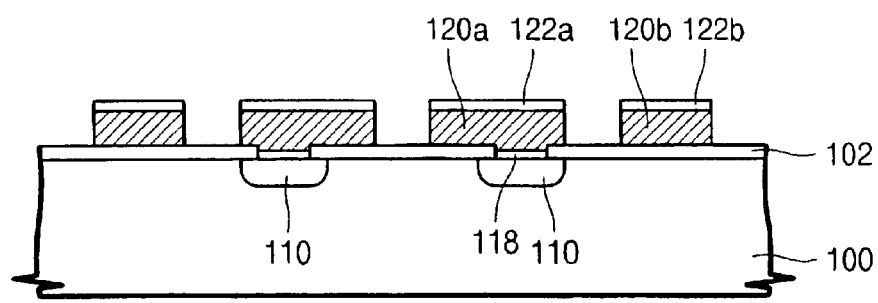
FIGS. 1 through 3 are cross-sectional views for illustrating a method of fabricating a conventional nonvolatile memory device.
Figure 2:
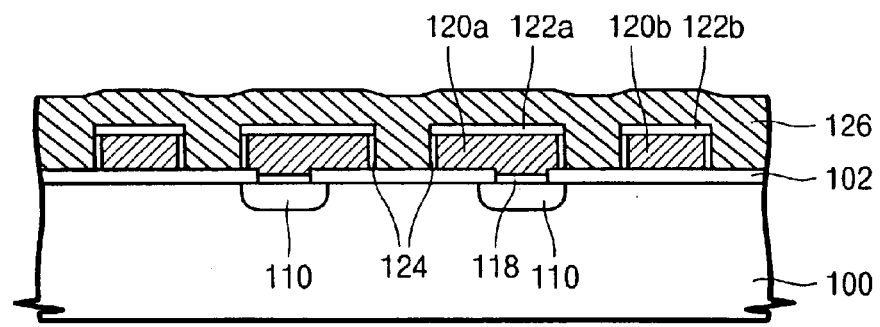
Figure 3:
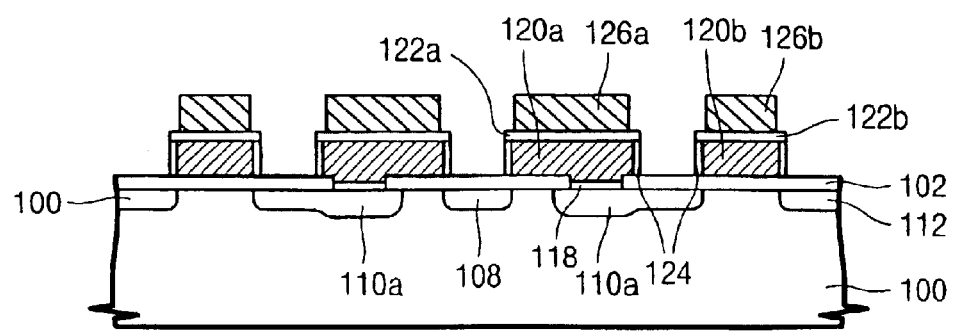
Figure 4:
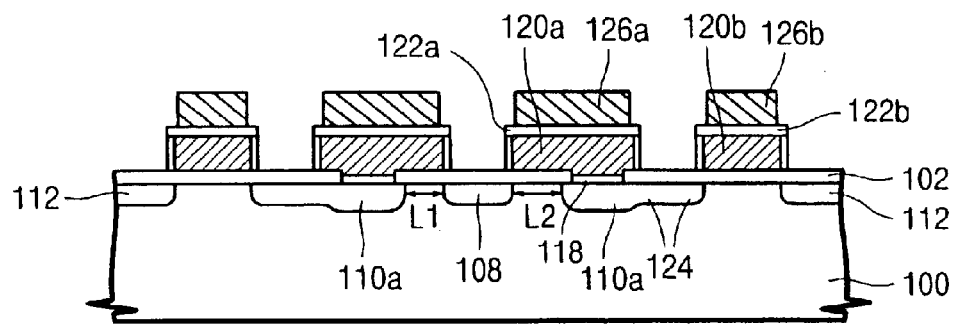
FIG. 4 is a cross-sectional view for illustrating disadvantages of the conventional nonvolatile memory device.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Figure 5:
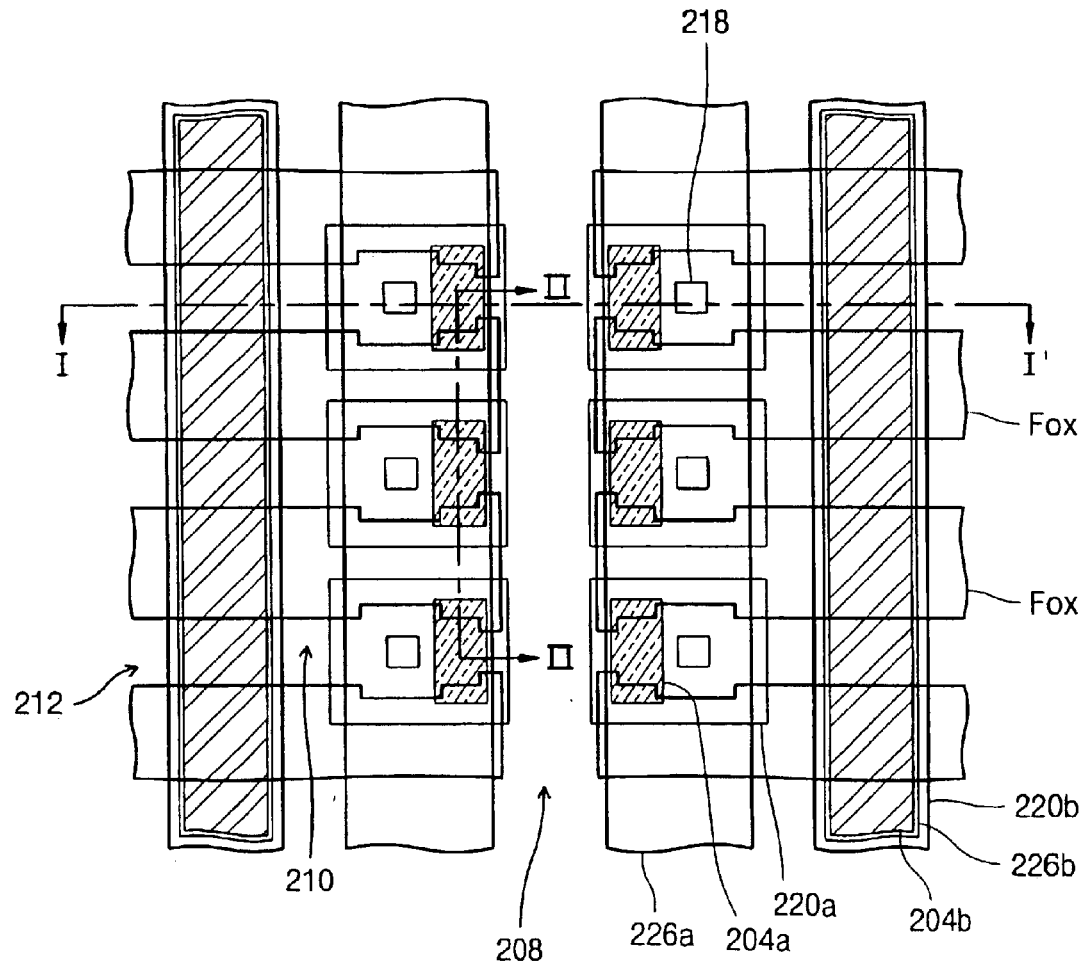
FIG. 5 is a top plan view of a nonvolatile memory device according to a first preferred embodiment of the present invention.
Figure 6:
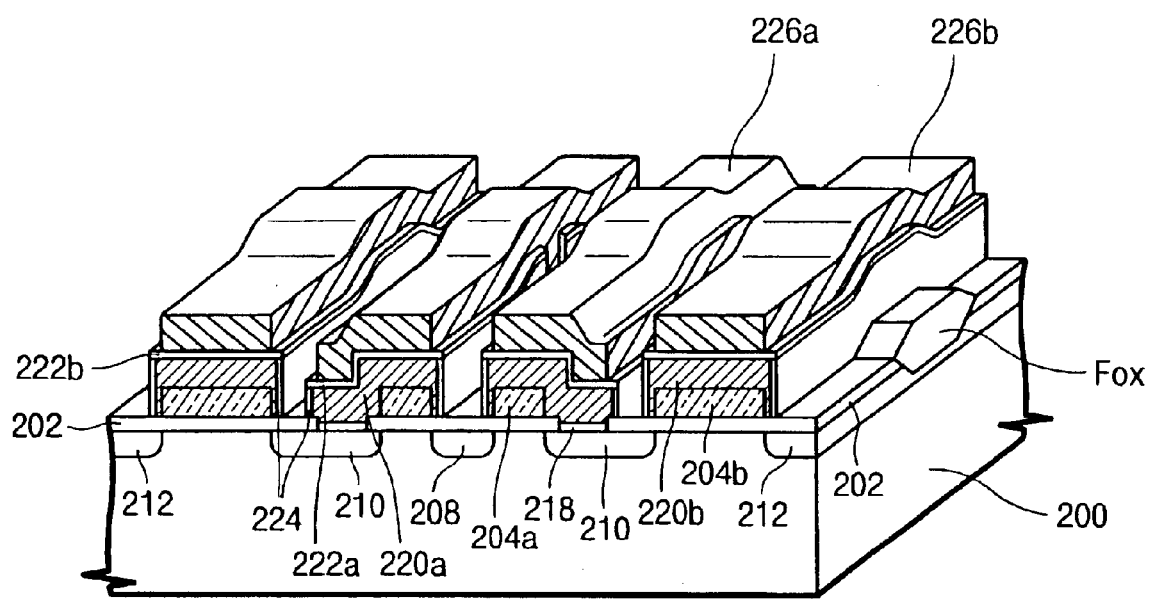
FIG. 6 is a perspective view of the nonvolatile memory device according to the first preferred embodiment of the present invention.

FIGS. 5 and 6 are a top plan view and a perspective view, respectively, of a nonvolatile memory device according to a first preferred embodiment of the present invention. Referring to FIGS. 5 and 6, the present invention includes a device isolation layer disposed at a predetermined region of a semiconductor substrate to define an active region. A memory gate pattern and a selection transistor pattern cross in a row over the active region. The memory gate includes a control gate electrode 226a crossing over the active region, and a floating gate pattern 220a interposed between the control gate electrode 226a and the active region. The memory gate further includes a gate interlayer dielectric layer 222a between the floating gate pattern 220a and the control gate pattern 226a. A first base pattern 204a is interposed between the floating gate pattern 220a and the active region.

The selection gate pattern includes a lower selection gate pattern 220b, an interlayer dielectric pattern 222b, and an upper selection gate 226b, which are sequentially stacked and cross over the active region. A second base pattern 204b is disposed under the lower selection gate pattern 220b to cross over the active region in parallel with the lower selection gate pattern 220b. A tunnel insulation layer 218 exists on the active region between the first and second base patterns 204a and 204b. The floating gate pattern 220a is extended from a top of the first base pattern 204a to cover the tunnel insulation layer 218. A gate insulation layer 202, which is thicker than the tunnel insulation layer 218, exists on the active region surrounding the tunnel insulation layer 218. The gate insulation layer 202 may be interposed between the first base pattern 204a and the active region, between the second base pattern 204b and the active region, between the floating gate pattern 220a and the active region, and between the lower selection gate pattern 220b and the active region. A channel region is disposed in the active region between the first and second base patterns 204a and 204b. A source region 208, which is separated from the channel region 210 by the first base pattern 204a, is disposed in the active region adjacent to the first base pattern 204a, while a drain region 212, which is separated from the channel region by the second base pattern 204b, is disposed in the active region adjacent to the second base pattern 204b.

In the first preferred embodiment, in a cross-sectional view of the memory gate, a width of the floating gate pattern 220a is larger than that of the control gate electrode 226a. In a cross-sectional view of the selection gate pattern, a width of the lower selection gate pattern 220b is larger than that of the upper selection gate pattern 226b. The source region 208 crosses the device isolation layer Fox to be connected to adjacent source regions. Preferably, the device isolation layer Fox between the adjacent source regions is cut so that the active regions are connected, and the source region 208 can be disposed in the connected active regions. The floating gate pattern 220a, the gate interlayer dielectric layer 222a and the control gate electrode 226a constitute a memory gate. The lower selection gate pattern 220b, the interlayer dielectric pattern 222b, and the lower selection gate pattern 226b constitute a selection gate.

FIGS. 7a, 8a, 9a, 10a, 11a, 12a, 13a and 14 are cross-sectional views for illustrating a method of fabricating a nonvolatile memory device according to the first embodiment of the present invention, the cross-sectional views taken along a line I-I' of FIG. 5. FIG. 15 is a cross-sectional view for illustrating a transformed example of-the first preferred embodiment of the present invention, the cross-sectional view taken along a line I-I' of FIG. 5.

FIGS. 7b, 8b, 9b, 10b, 11b, 12b and 13b are cross-sectional views for illustrating a method of fabricating a nonvolatile memory device according to the first embodiment of the present invention, the cross-sectional views taken along a line II-II' of FIG. 5.

Figure 7A:
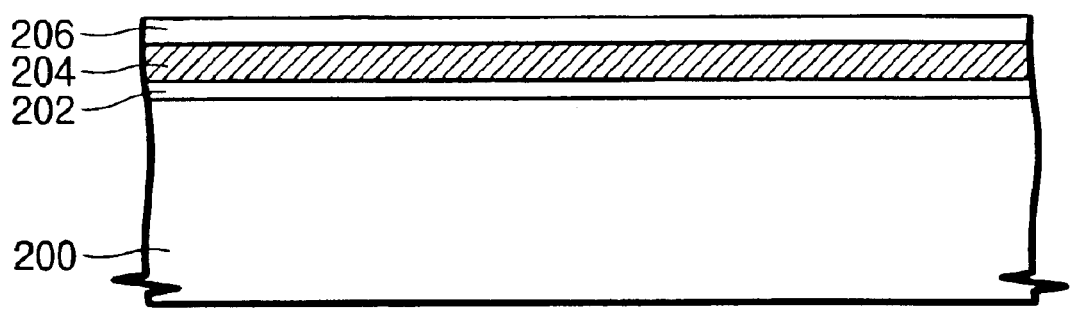
FIGS. 7a, 8a, 9a, 10a, 11a, 12a, 13a, 14, and 15 are cross-sectional views for illustrating a method of fabricating the nonvolatile memory device according to the first preferred embodiment of the present invention, the cross-sectional views taken along a line I-I' of FIG. 5.
Figure 7B:
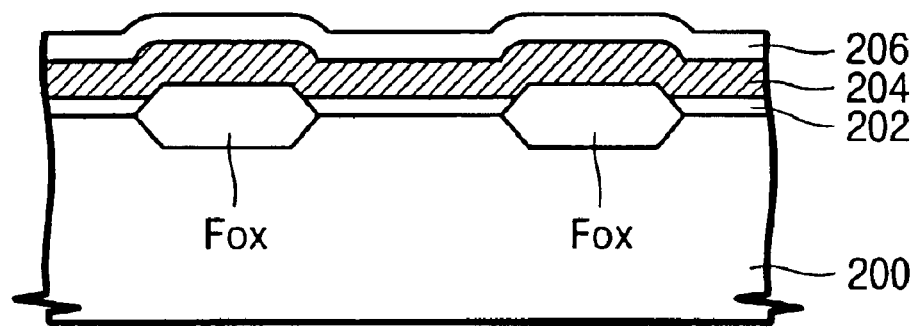
FIGS. 7b, 8b, 9b, 10b, 11b, 12b and 13b are cross-sectional views for illustrating a method of fabricating the nonvolatile memory device according to the first preferred embodiment of the present invention, the cross-sectional views taken along a line II-II' of FIG. 5.

Referring to FIGS. 7a and 7b, a device isolation layer Fox is formed at a predetermined region of a semiconductor substrate 200 to define active regions. A gate insulation layer 202, a base conductive layer 204, and an upper insulation layer 206 are sequentially formed on an entire surface of the resultant structure where the device isolation layer Fox is formed. The base conductive layer 204 is preferably composed of polysilicon. The upper insulation layer 206 is preferably an insulation layer having an etch selectivity with respect to the base conductive layer 204 and the gate insulation layer 202, for example, a silicon nitride layer.

Figure 8A:
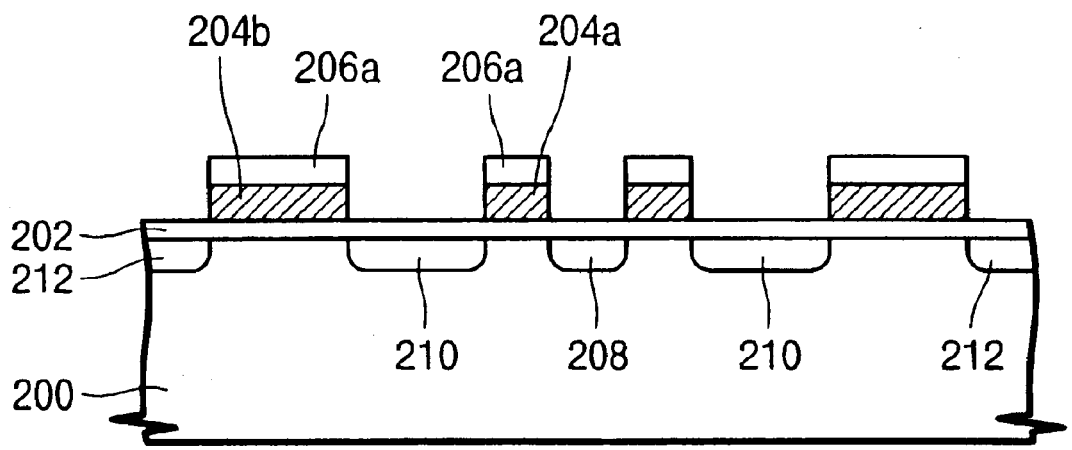
Figure 8B:
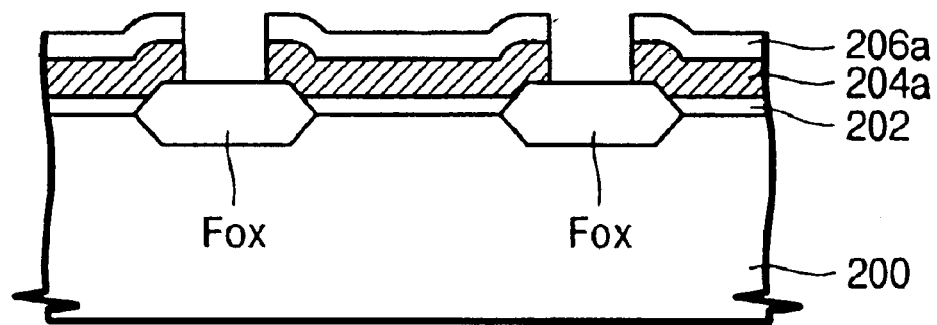

Referring to FIGS. 8a and 8b, the upper insulation layer 206 and the base conductive layer 204 are successively patterned to form first and second base patterns 204a and 204b. The first base pattern 204a covers the active regions and the second base pattern 204b is separated from the first base patterns 204a to cross the active region. An upper insulation pattern 206a covers the first and second base patterns 204a and 204b. The first base patterns 204a cover the active region, and edges of the first base patterns 204a are extended to overlap with the device isolation layer Fox. Groups including the first and second base patterns 204a and 204b are adjacent to each other in a memory cell array and disposed symmetrically. A channel region 210 is formed in the active region between the first and second base patterns 204a and 204b. A source region 208 is formed in the active region separated from the channel region 210 by the first base pattern 204a. A drain region 212 is formed in the active region separated from the channel region 210 by the second base pattern 204b. The source region 208 is adjacent to the first base pattern 204a, while the drain region 212 is adjacent to the second base pattern 204b. The channel region 210, the source region 208, and the drain region 212 may be formed in the active region by an ion implantation process using the first and second base patterns 204a and 204b and the upper insulation pattern 206a as an ion implantation mask.

It is preferable that the adjacent source regions 208, which are separated by the device isolation layer Fox, are electrically connected to each other. For this, it is preferable not to form the device isolation layer Fox between the regions where the source regions 208 will be formed. Accordingly, the adjacent source regions 208 are connected to each other to form a common source line crossing the device isolation layer FOX.

Figure 9A:
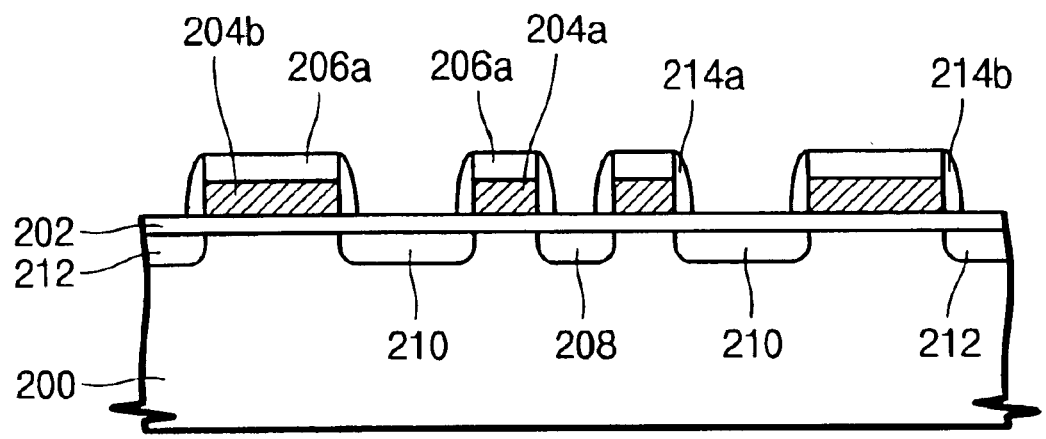
Figure 9B:
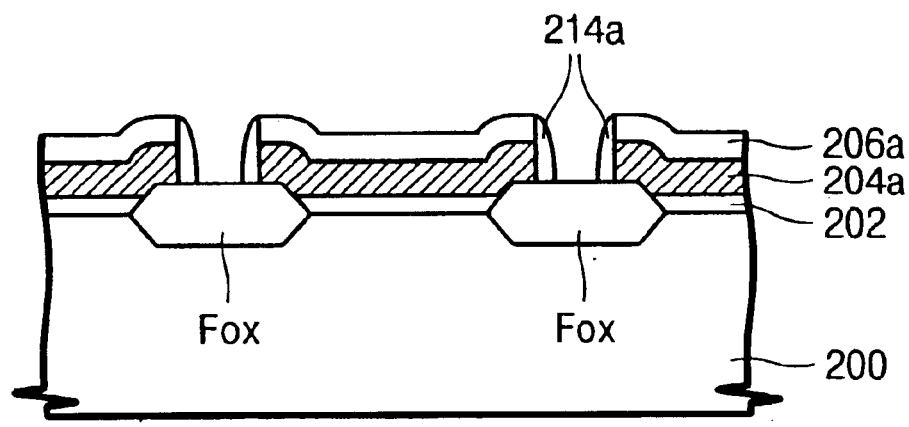

Referring to FIGS. 9a and 9b, a first sidewall spacer 214a is formed on each of sidewalls of the first base patterns 204a and the upper insulation patterns 206a, which are sequentially stacked. A second sidewall spacer 214b is formed on each of sidewalls of the second base patterns 204b and the upper insulation patterns 206a, which are sequentially stacked. The first and second sidewall spacers 214a and 214b are preferably insulation layers having an etch selectivity with respect to the gate insulation layer 202.

Figure 10A:
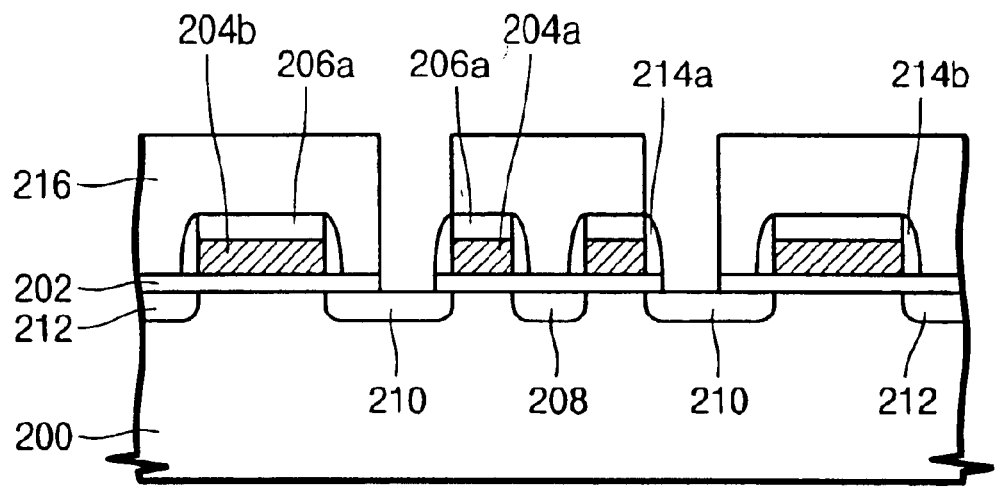
Figure 10B:
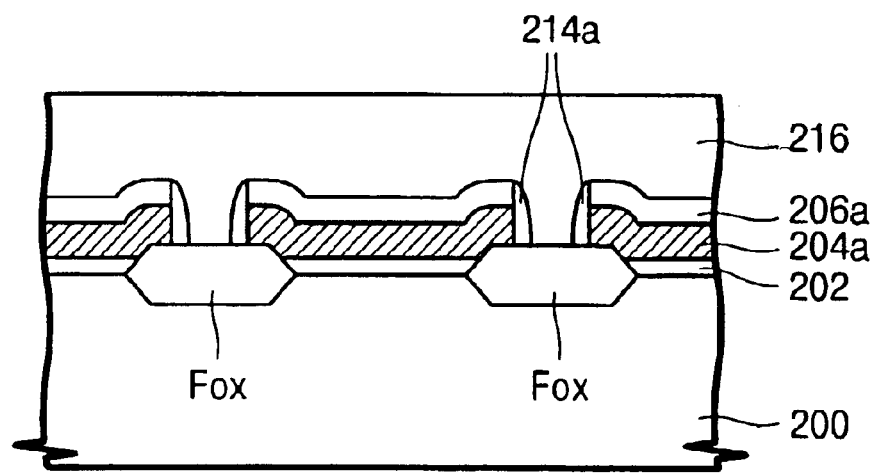

Referring to FIGS. 10a and 10b, a photoresist pattern 216 is formed on the resultant structure where the first and second sidewall spacers 214a and 214b are formed. The photoresist pattern 216 exposes a predetermined portion of the gate insulation layer 202 between the first and second sidewall spacers 214a and 214b. By using the photoresist pattern 216 as an etch mask, the predetermined portion of the gate insulation layer 202 is etched to expose a portion of the semiconductor substrate 200.

The photoresist pattern 216 preferably exposes the first sidewall spacers 214a and the gate insulation layer 202 between the first and second base pattern 204a and 204b. Thus, the edges of the exposed semiconductor substrate 200 are aligned to edges of the first sidewall spacer 214a.

Figure 11A:
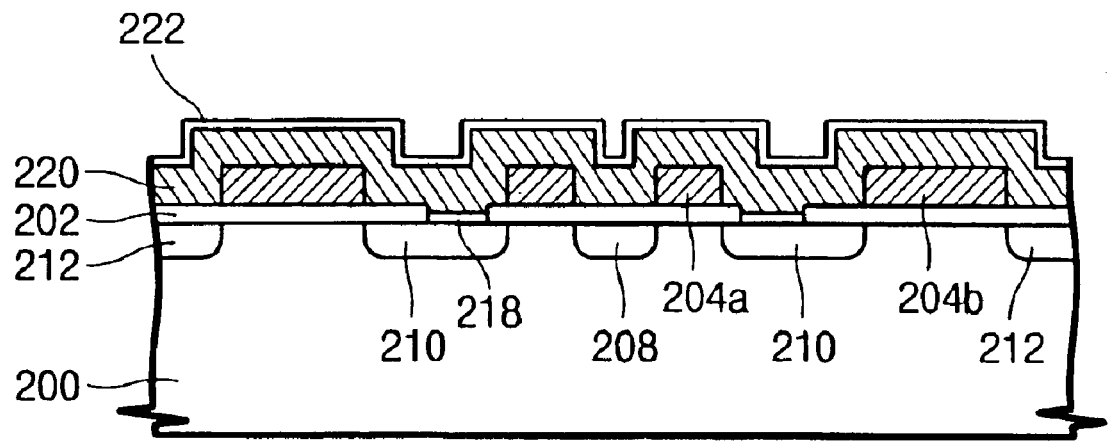
Figure 11B:
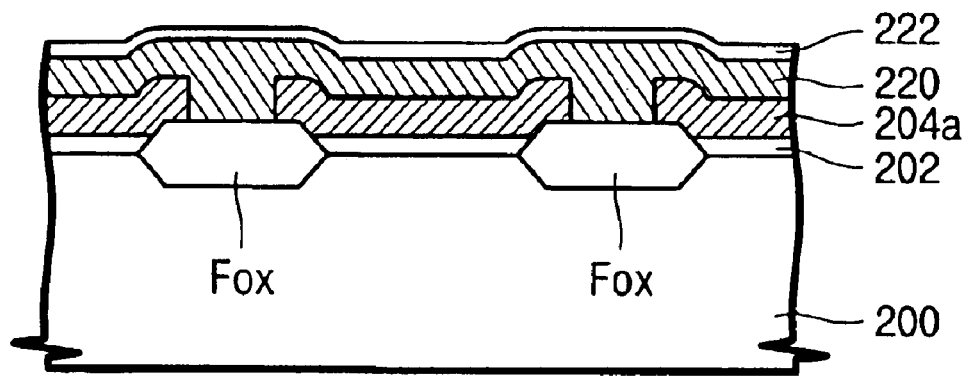

Referring to FIGS. 11a and 11b, the photoresist pattern 216, the upper insulation pattern 206a, and the first and second sidewall spacers 214a and 214b are removed. Continuously, a tunnel insulation layer 218, which is thinner than the gate insulation layer 202, is formed on the exposed semiconductor substrate. For instance, annealing can be performed into the semiconductor substrate to form a thermal oxide layer on the exposed semiconductor substrate, thereby enabling formation of the tunnel insulation layer 218. A lower conductive layer 220 and a dielectric layer 222 are conformally formed on an entire surface of the resultant structure where the tunnel insulation layer 218 is formed.

The lower conductive layer 220 may be a polysilicon layer and the dielectric layer 222 may be an oxide-nitride-oxide (ONO) layer.

Figure 12A:
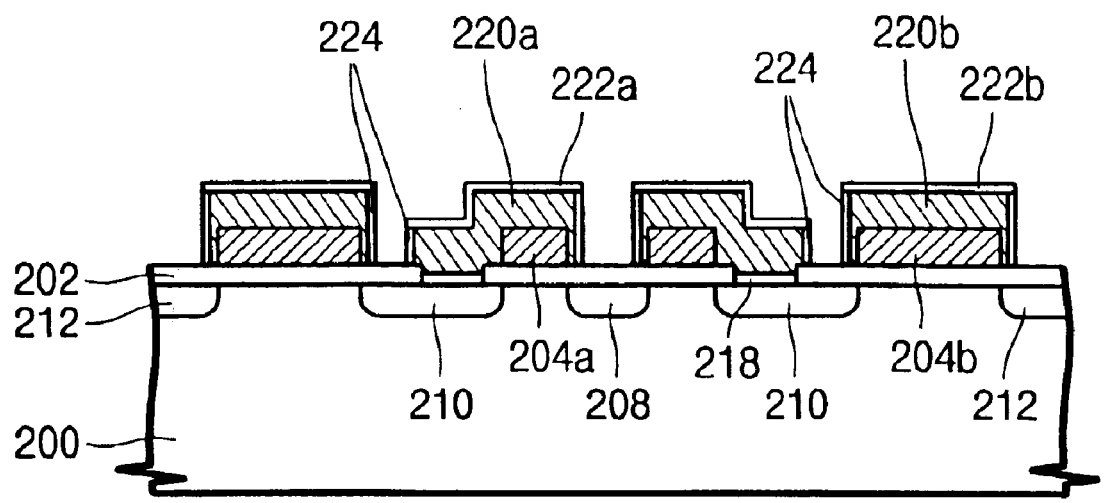
Figure 12B:
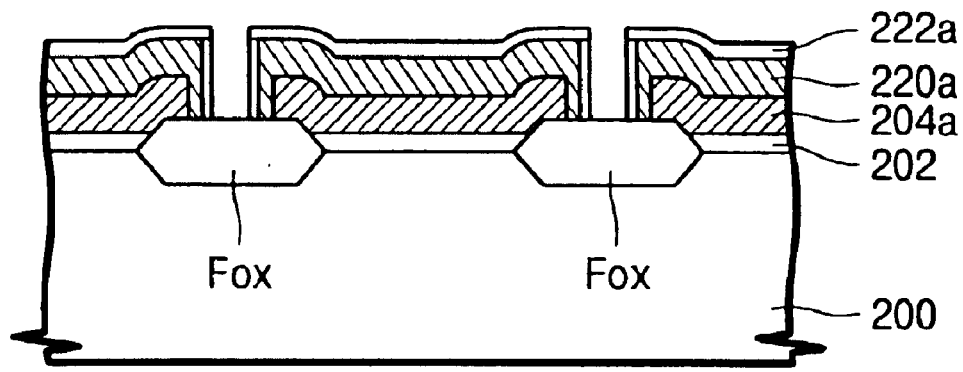

Referring to FIGS. 12a and 12b, the dielectric layer 222 and the lower conductive layer 220 are successively patterned to form a floating gate pattern 220a and a gate interlayer dielectric layer 222a. The floating gate pattern 220a covers the first base pattern 204a and the tunnel insulation layer 218, and the gate interlayer dielectric layer 222a covers the floating gate pattern 220a. A lower selection gate pattern 220b is then formed on the second base pattern 204b to cross the active regions, and an interlayer dielectric pattern 222b is formed on the lower selection gate pattern 220b. The first base pattern 204a and the floating gate pattern 220a constitute a floating gate of a memory transistor. Likewise, the second base pattern 204b and the lower selection gate pattern 220b constitute a lower selection gate of the selection transistor. At this time, a sidewall of the first base pattern 204a adjacent to the channel region 210 is preferably covered with the floating gate pattern 220a. Similarly, a sidewall of the second base pattern 204b adjacent to the channel region 210 is preferably covered with the lower selection gate pattern 220b. This makes it possible to prevent edges of the first and second base patterns 204a and 204b from being etched, when misalignment arises during a photolithography process for forming the floating gate pattern 220a and the lower selection gate pattern 220b.

Figure 12C:
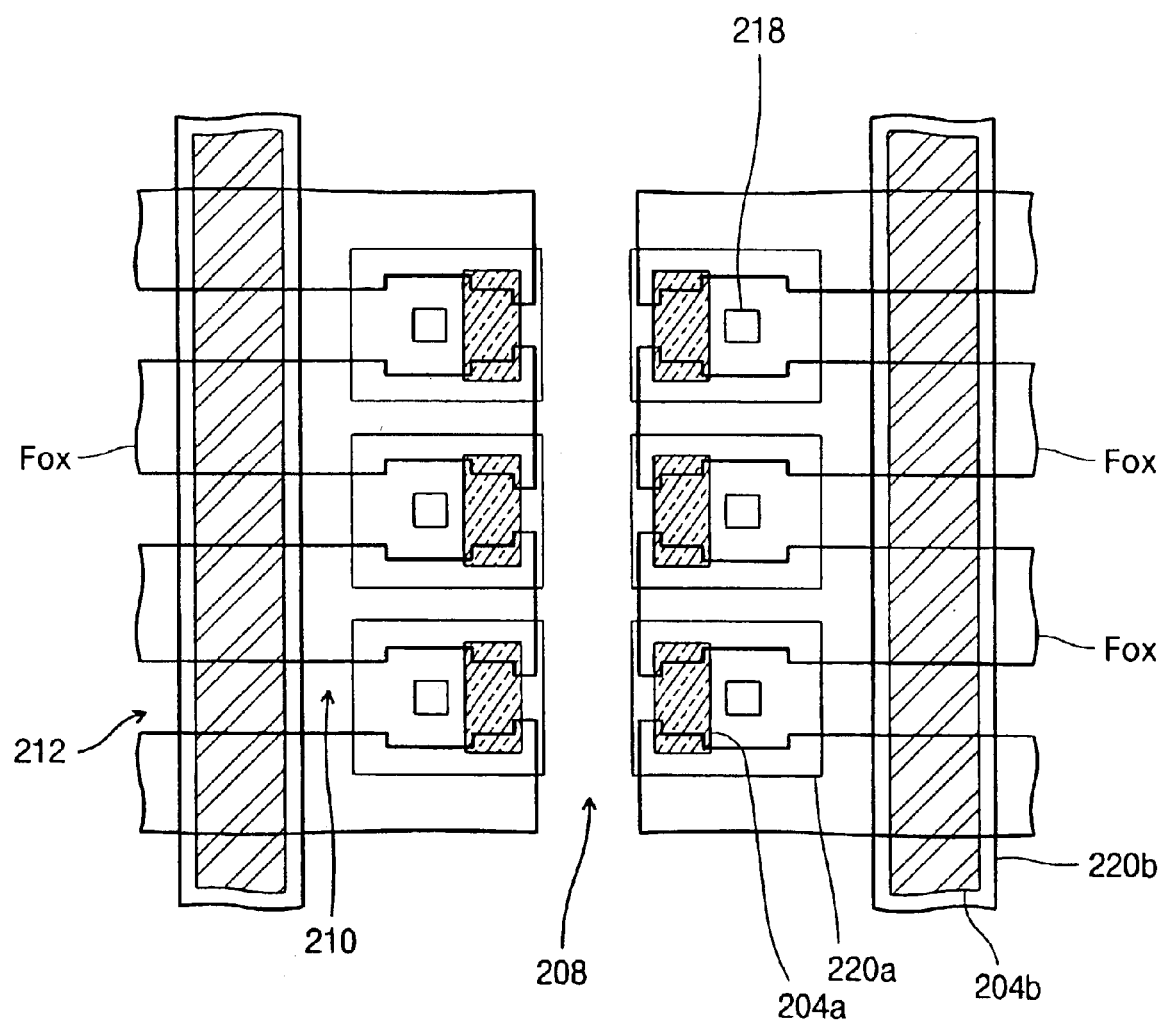
FIG. 12c is a top plan view of the nonvolatile memory device as illustrated in FIGS. 12a and 12b according to the first preferred embodiment of the present invention.

Next, a sidewall insulation layer 224 is formed on sidewalls of the floating gate and the lower selection gate. The sidewall insulation layer 224 is preferably formed on sidewalls of the floating gate pattern 220a and the lower selection gate pattern 220b. However, in the event that the sidewall of the first base pattern 204a or the sidewall of the second base pattern 204b is exposed, the sidewall insulation layer 224 may cover the exposed sidewall of the first or second base pattern 204a or 204b. That is, every structure having conductivity, which is formed on the semiconductor substrate, is surrounded by an insulation layer. The sidewall insulation layer 224 may be a thermal oxide layer, which is obtained by performing thermal process into the resultant structure where the floating gate pattern 220a and the lower selection gate pattern 220b are formed. As illustrated in FIG. 12c, the first preferred embodiment of the present invention includes island-shaped floating gate patterns 220a, which are separated from each other on the active regions.

Figure 13A:
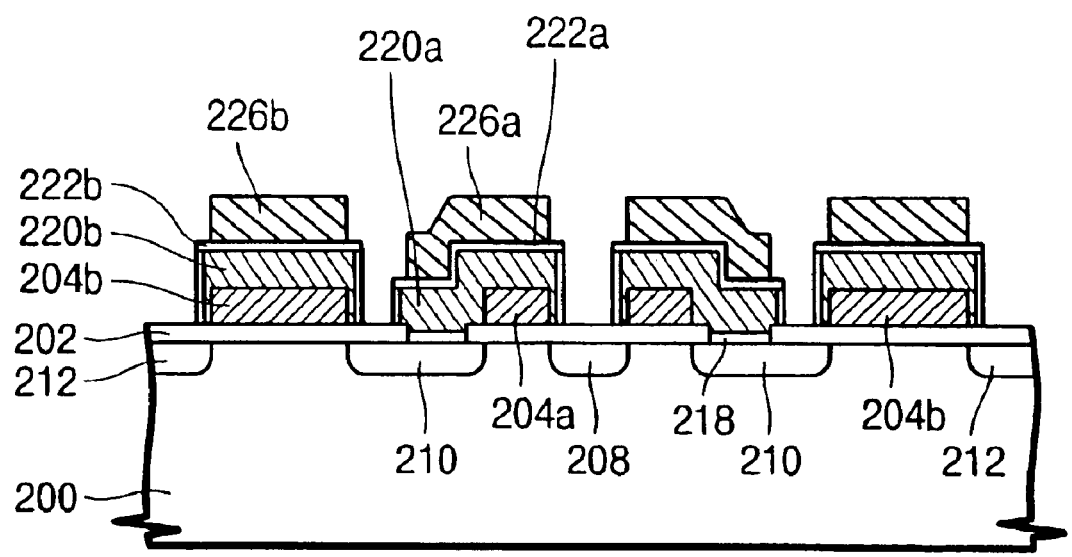
Figure 13B:
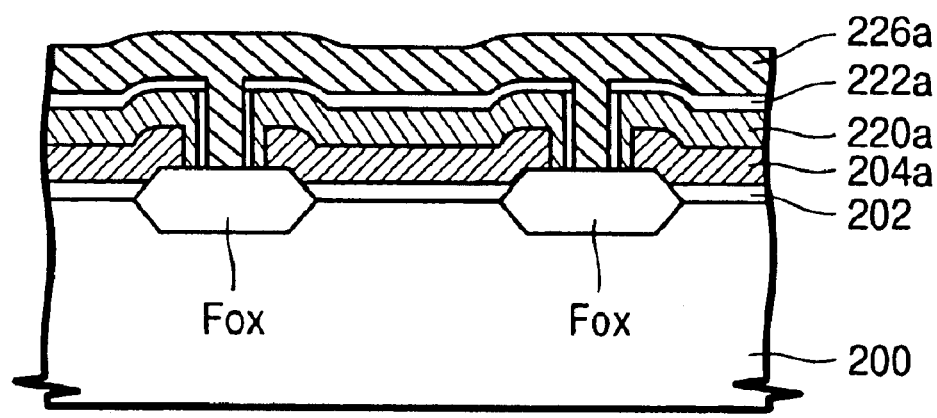

Referring to FIGS. 13a and 13b, an upper conductive layer is formed on an entire surface of the resultant structure where the sidewall insulation layer 224 is formed. The upper conductive layer is then patterned to form a control gate electrode 226a and an upper selection gate 226b. The control gate electrode 226a crosses the active region over the floating gate pattern 220a, and the upper selection gate 226 crosses the active region over the lower selection gate pattern 220b. The upper conductive layer is preferably a polysilicon layer or a metal polycide layer. In this case, a width of the control gate electrode 226a is smaller than that of the floating gate pattern 220a, and a width of the upper selection gate 226b is smaller than that of the lower selection gate pattern 220b.

According to the present invention, the floating gate pattern 220a conformally covers the first base pattern 204a. Thus, because an elevation of the floating gate pattern 220a over the base pattern 204a is higher than that over the channel region, the floating gate pattern 220a has a flexural surface. As a result, the nonvolatile memory device of the present invention may have a gate interlayer dielectric layer occupying a large surface area within a limited area.

Before forming the upper conductive layer, a portion of the interlayer dielectric pattern 222b is removed from the lower selection gate pattern 220b. This enables an electrical connection between the upper selection gate 226b and the lower selection gate pattern 220b.

Figure 14:
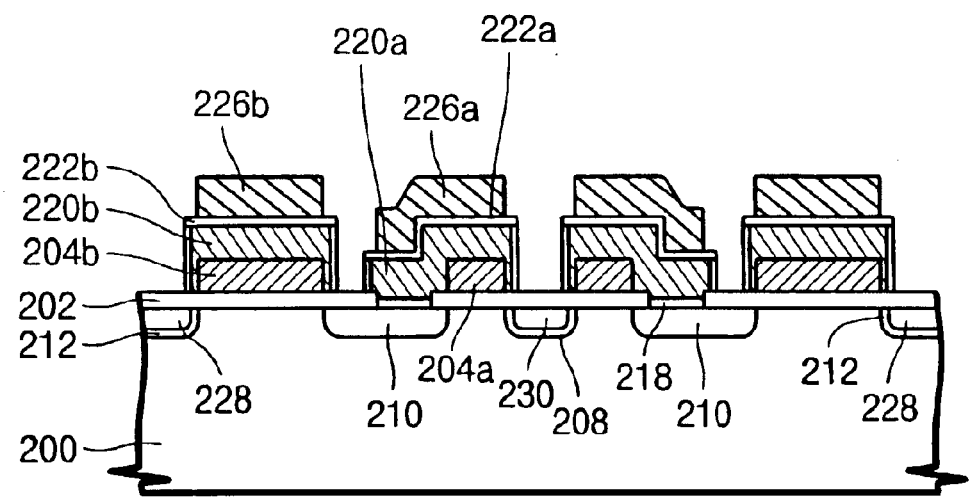
Figure 15:
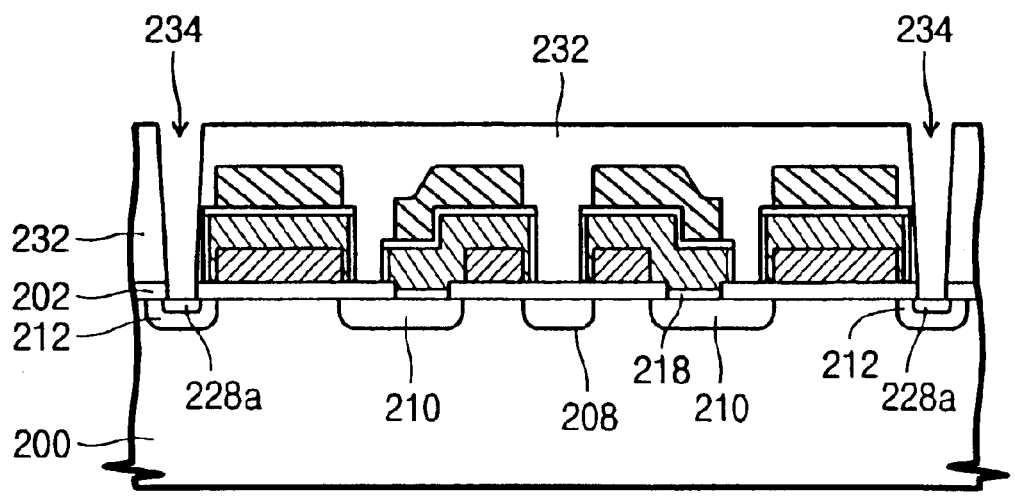

Referring to FIG. 14, impurities may be doped into the source region 208 between the opposite floating gate patterns 220a, thereby forming a heavily doped source region 230. Likewise, by doping impurities into the drain region 212 between the opposite lower selection gate patterns 220b, a heavily doped drain region 228 may be formed.

In another method, referring to FIG. 15, the heavily doped source and drain regions 230 and 228 are not formed. An insulation layer 232 is formed on an entire surface of the resultant structure where the control gate electrode 226a and the upper selection gate 226b are formed. The insulation layer 232 is then patterned to form bit line contact holes 234 exposing the drain regions 210. By using the insulation layer 232 as an ion implantation mask, impurities may be implanted into the drain region exposed to the bit line contact holes 234 so that a heavily doped drain region 228a can be formed. In this case, although not shown in the drawings, contact holes may be formed to expose the source region 208, the control gate electrode 226a, and the upper selection gate 226b, respectively, at a predetermined region of the semiconductor substrate.

Figure 16:
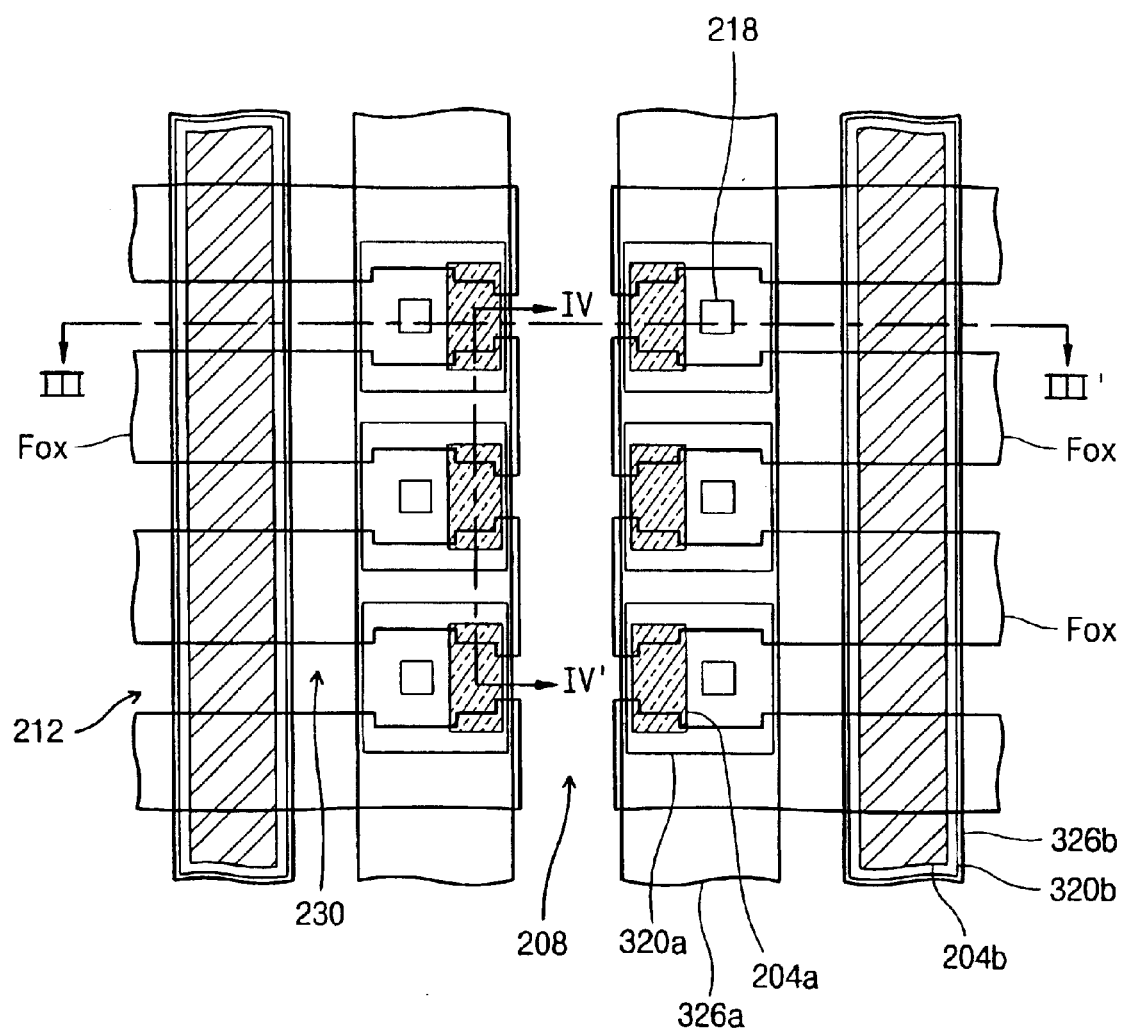
FIG. 16 is a top plan view of the nonvolatile memory device according to a second preferred embodiment of the present invention.
Figure 17:
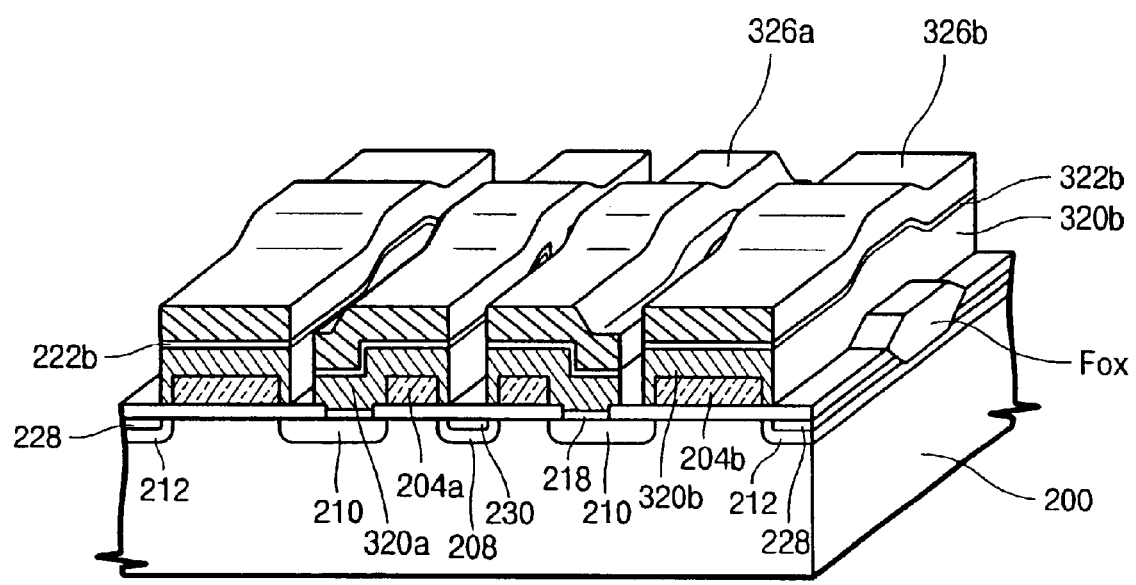
FIG. 17 is a perspective view of the nonvolatile memory device according to the second preferred embodiment of the present invention.

FIG. 16 is a top plan view of a nonvolatile memory device according to a second preferred embodiment of the present invention. FIG. 17 is a perspective view of the nonvolatile memory device according to the second preferred embodiment of the present invention.

Referring to FIGS. 16 and 17, the nonvolatile memory device according to the second embodiment of the present invention is similar to that of the foregoing first preferred embodiment. A difference from the foregoing first preferred embodiment is that a floating gate pattern 320a and a lower selection gate pattern 320b have sidewalls aligned to sidewalls of a control gate electrode 326a and an upper selection gate pattern 326b, respectively. Thus, in a cross-sectional view of the control gate electrode 326a, a width of the floating gate pattern 320a is the same as that of the control gate electrode 326a, and a width of the lower selection gate pattern 320b is the same as that of the upper selection gate pattern 326b.

Specifically, a device isolation layer is disposed at a semiconductor substrate to define an active region. A memory gate pattern and a selection transistor pattern cross in a row over the active region. The memory gate comprises a control gate electrode 326a crossing over the active region, and a floating gate pattern 320a interposed between the control gate electrode 326a and the active region. The memory gate further comprises a gate interlayer dielectric layer 322a between the floating gate pattern 320a and the control gate pattern 326a. A first base pattern 204a is interposed between the floating gate pattern 320a and the active region.

A channel region exists in the active region between the first and second base patterns 204a and 204b. Also, a source region 208, which is separated from the channel region 210, is formed in the active region adjacent to the first base pattern 204a, while a drain region 212, which is separated from the channel region 210, is formed in the active region adjacent to the second base pattern 204b. The adjacent source regions 208, which are separated by the device isolation layer FOX, are electrically connected to each other. Preferably, the device isolation layer Fox between the source regions 208 is cut such that the active regions are connected to each other, and the source region 208 is formed in the connected active region.

Figure 18A:
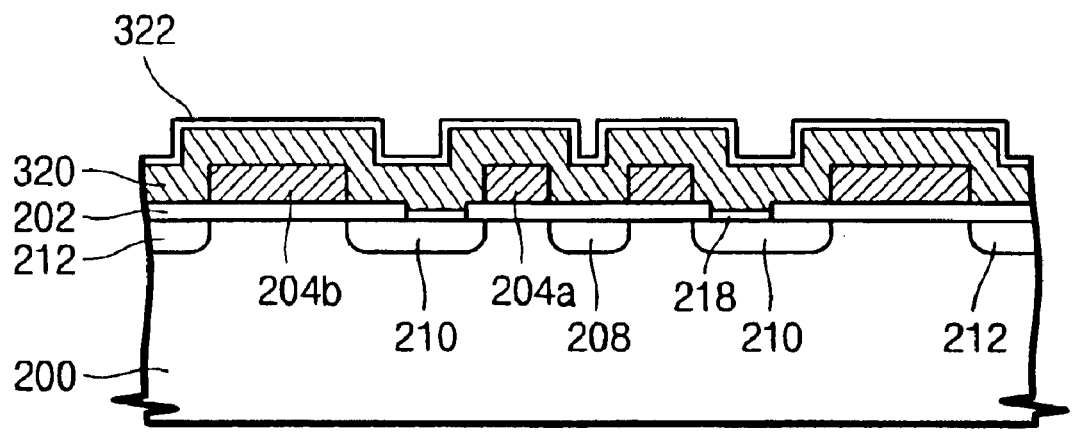
FIGS. 18a, 19a, and 20 are cross-sectional views for illustrating a method of fabricating the nonvolatile memory device according to the second preferred embodiment of the present invention, the cross-sectional views taken along a line III-III' of FIG. 16.
Figure 19A:
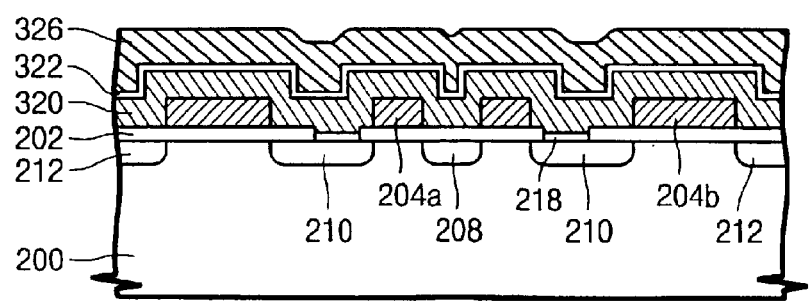
Figure 20:
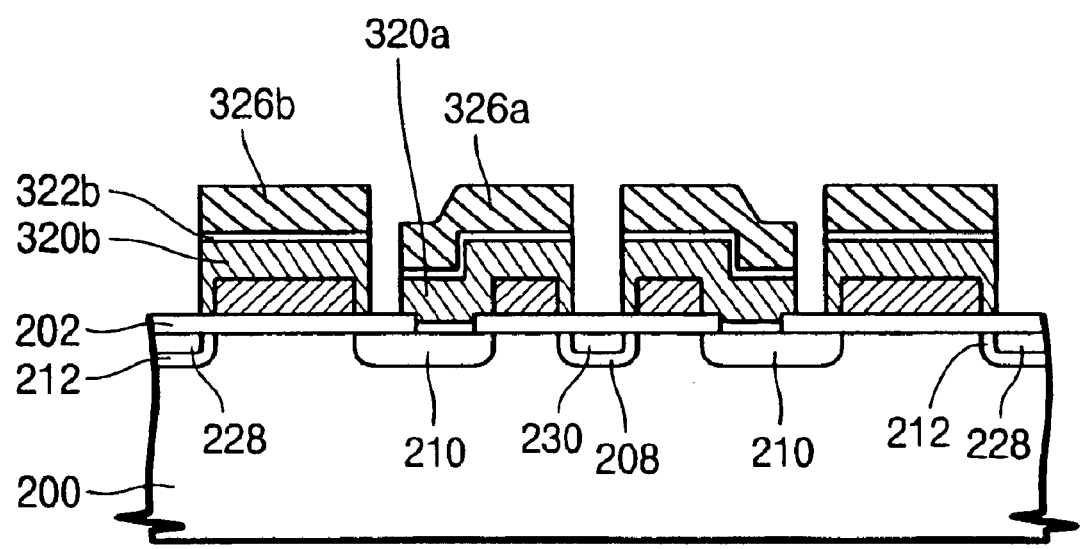

FIGS. 18a, 19a, and 20 are cross-sectional views for illustrating a method of fabricating the nonvolatile memory device according to the second preferred embodiment of the present invention, the cross-sectional views taken along a line III-III' of FIG. 16.

Figure 18B:
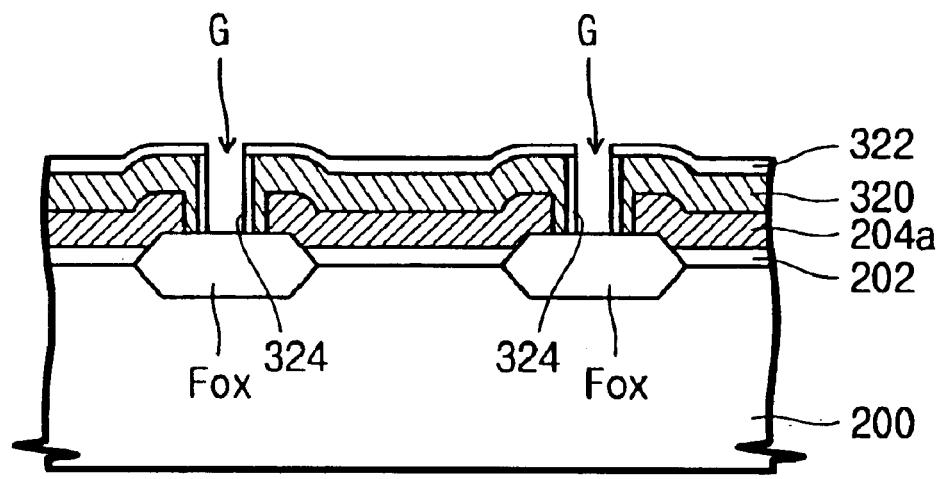
FIGS. 18b and 19b are cross-sectional views for illustrating a method of fabricating the nonvolatile memory device according to the second preferred embodiment of the present invention, the cross-sectional views taken along a line IV-IV' of FIG. 16.
Figure 19B:
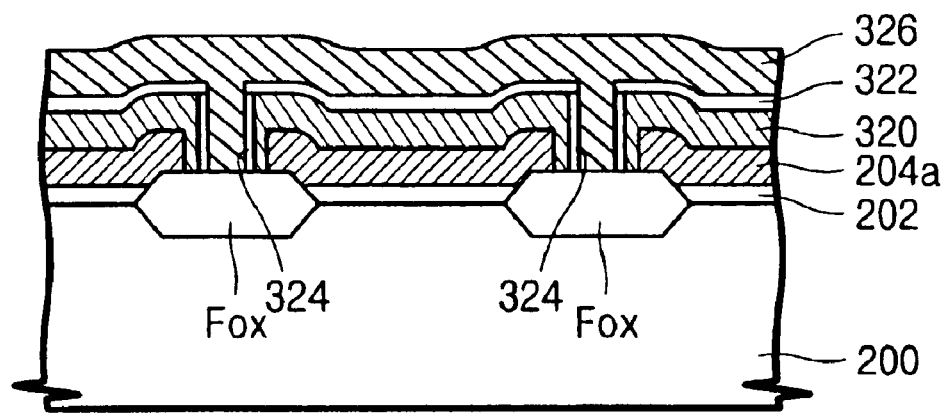

FIGS. 18b and 19b are cross-sectional views for illustrating a method of fabricating the nonvolatile memory device according to the second preferred embodiment of the present invention, the cross-sectional views taken along a line IV-IV' of FIG. 16.

Referring to FIGS. 18a and 18b, first and second base patterns 204a and 204b, a lower conductive layer 320, and a dielectric layer 322 may be formed according to the process steps of the first preferred embodiment, as illustrated in FIGS. 7a, 8a, 9a, 10a, 11a, 7b, 8b, 9b, 10b and 11B. The dielectric layer 322 and the lower conductive layer 320 are successively patterned to form isolated grooves G on the device isolation layer Fox. A sidewall insulation layer 324 is formed on inner sidewalls of the grooves G.

Figure 18C:
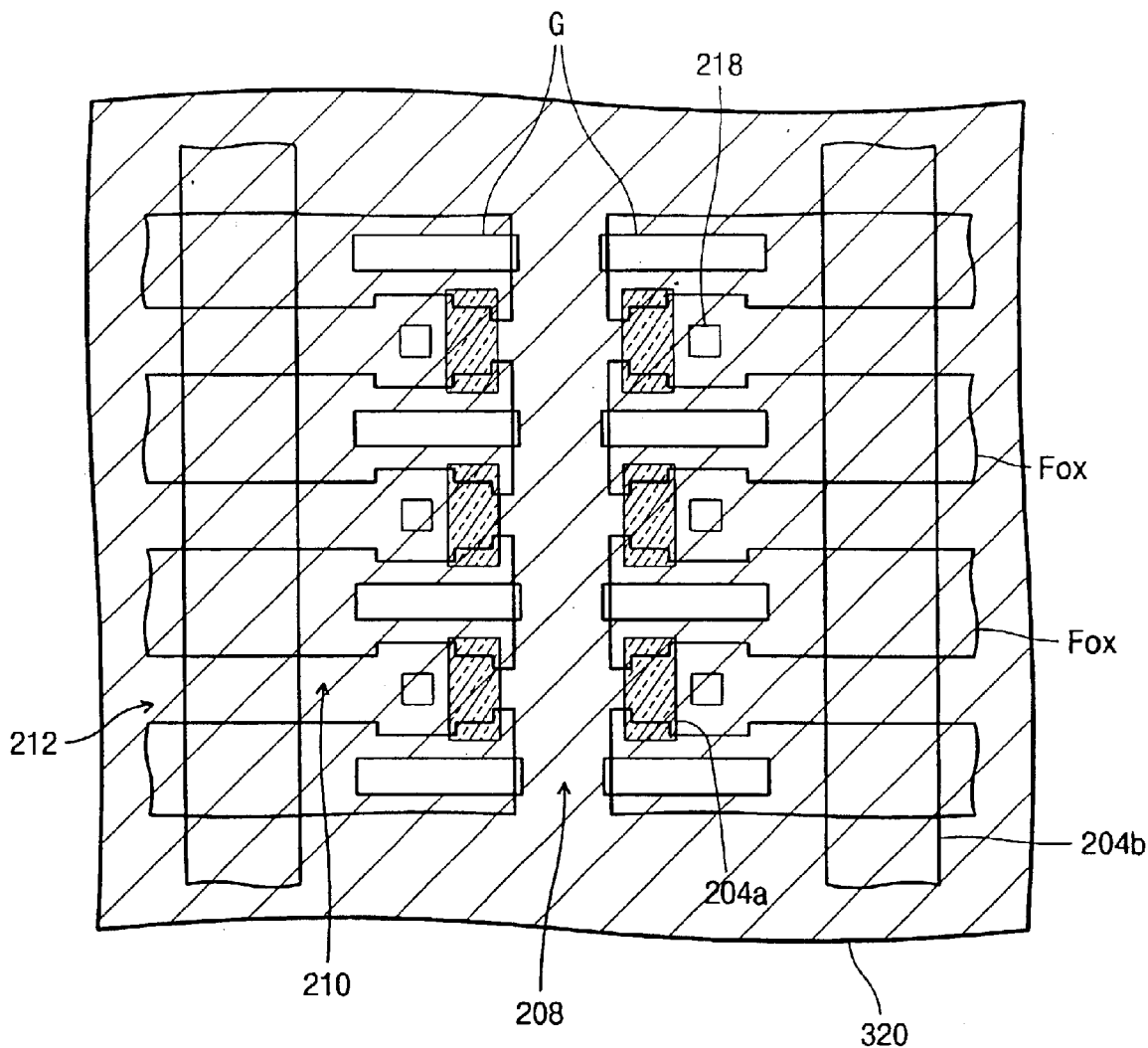
FIG. 18c is a top plan view of the nonvolatile memory device as illustrated in FIGS. 18a and 18b according to the second preferred embodiment of the present invention.

FIG. 18c is a top plan view of the resultant structure where the grooves are formed. Referring to FIG. 18c, the grooves G are formed on the device isolation layer Fox between the first base patterns 204a as well as on the device isolation layer Fox between the tunnel insulation layers 218. In a cross-sectional view of the second base pattern 204b, widths of the grooves G are preferably designed to be larger than a width of a control gate electrode (326a of FIG. 17), which will be formed during a subsequent process.

Referring to FIGS. 19a and 19b, an upper conductive layer is formed on an entire surface of the resultant structure where the sidewall insulation layer 324 is formed. The upper conductive layer 326 and the lower conductive layer 320 are electrically insulated by the dielectric layer 322 and the sidewall insulation layer 324.

In another method, although not shown in the drawings, the dielectric layer is formed after forming the grooves. In this case, the lower and upper conductive layers may be insulated only by the dielectric layer.

Referring to FIG. 20, the upper conductive layer 326, the dielectric layer 322, and the lower conductive layer 320 are successively patterned to form a control gate electrode 326a crossing the active region, and an upper selection gate 326b crossing the active region in parallel with the control gate electrode 326a. A floating gate pattern 320a is formed between the control gate electrode 326a and the active region. A gate interlayer dielectric layer 322a is interposed between the floating gate pattern 320a and the control gate electrode 326a. Also, a lower selection gate pattern 320b, which has sidewalls aligned to sidewalls of the upper selection gate 326b, is formed under the upper selection gate 326b. An interlayer dielectric pattern 322b is interposed between the upper selection gate pattern 326b and the lower selection gate pattern 320b. At this time, before forming the upper conductive layer 326, a portion of the dielectric layer 322 is removed such that the upper selection gate pattern 326b and the lower selection gate pattern 320b are electrically connected to each other at a predetermined region of the semiconductor substrate.

The lower selection gate pattern 320b and the second base patterns 204b constitute a lower selection gate, and the first base pattern 204a and the floating gate pattern 320a constitute a floating gate.

In a cross-sectional view of the control gate electrode 326a, the control gate electrode 326a is patterned such that a width of the control gate electrode 326a is smaller than widths of the grooves G. As a result, the floating gate patterns 320a, which are formed to be self-aligned to the control gate electrode 326a, can be island-shaped.

Like the foregoing first preferred embodiment, a heavily doped source region 230 may be formed in the source region 208 between the floating gate patterns 320a, and a heavily doped drain region 228 may be formed in the drain region 212 between the lower selection gates.

According to the present invention as described above, base patterns are formed before forming a memory gate and a selection gate, thereby forming a source region, a drain region, and a channel region, which are aligned to sidewalls of the base patterns. This makes it possible to prevent changes of a distance from the source region to the channel region due to misalignment of the gates. As a result, it is capable of fabricating a nonvolatile memory device having a cell array in which memory cells, which are formed repeatedly and symmetrical with respect to each other, have uniform threshold voltages.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A nonvolatile memory device, comprising:
   first and second base patterns disposed on a semiconductor substrate to be separated from each other by a predetermined space;
   a channel region formed in the semiconductor substrate between the first and second base patterns;
   source and drain regions formed in the semiconductor substrate adjacent to the first and second base patterns, respectively, and separated from the channel region by the first and second base patterns, respectively;
   a memory gate covering the first base pattern, the memory gate being extended from the first base pattern to a predetermined region of the channel region;
   a tunnel insulation layer interposed between the memory gate and the channel region; and
   a selection gate covering the second base pattern.

2. The device as claimed in claim 1, wherein the memory gate comprises:
   a floating gate pattern covering the first base pattern and the predetermined region of the channel region;
   a control gate electrode covering the floating gate pattern; and
   a gate interlayer dielectric layer interposed between the control gate electrode and the floating gate pattern.

3. The device as claimed in claim 2, wherein an elevation of the floating gate pattern over the first base pattern is higher than that over the channel region.

4. The device as claimed in claim 2, wherein the floating gate pattern and the first base pattern constitute a floating gate,
   wherein a sidewall of the floating gate is covered with a sidewall insulation layer.

5. The device as claimed in claim 1, wherein the selection gate comprises a lower selection gate pattern, an interlayer dielectric pattern, and an upper selection gate, which are sequentially stacked,
   wherein the upper selection gate and the lower selection gate pattern penetrate the interlayer dielectric pattern to be connected to each other.

6. The device as claimed in claim 1, wherein the source region is formed to be adjacent to the first base pattern.

7. The device as claimed in claim 1, wherein the drain region is formed to be adjacent to the second base pattern.

8. The device as claimed in claim 1, further comprising a gate insulation layer disposed around the tunnel oxide layer between the floating gate and the semiconductor substrate, and interposed between the selection gate and the semiconductor substrate, between the first base pattern and the semiconductor substrate, and between the second base pattern and the semiconductor substrate.

9. A nonvolatile memory device, comprising:

a device isolation layer disposed at a predetermined region of a semiconductor substrate, the device isolation layer defining an active region;

a memory gate and a selection gate crossing in a row over the active region;

a first base pattern interposed between the memory gate and the active region;

a second base pattern disposed under the selection gate, the second base pattern crossing over the active region in parallel with the first base pattern;

a channel region formed in the active region between the first and second base patterns;

source and drain regions formed in the active region adjacent to the first and second base patterns, respectively, and separated from the channel region by the first and second base patterns, respectively; and a tunnel insulation layer disposed in a predetermined region between the channel region and the memory gate.

10. The device as claimed in claim 9, wherein the memory gate comprises:

a control gate electrode crossing the active region;

a floating gate pattern interposed between the control gate electrode and the active region; and a gate interlayer dielectric layer interposed between the control gate electrode and the floating gate pattern, wherein the floating gate pattern covers the first base pattern and a portion of the channel region.

11. The device as claimed in claim 10, wherein the floating gate pattern and the first base pattern constitute a floating gate, wherein the gate interlayer dielectric layer covers the floating gate pattern, and a sidewall insulation layer is additionally interposed between the control gate electrode and sidewalls of the floating gate.

12. The device as claimed in claim 10, wherein, in a cross-sectional view of the control gate electrode, a width of the floating gate is larger than that of the control gate electrode.

13. The device as claimed in claim 10, wherein the floating gate pattern has a flexural surface, wherein a top of the first base pattern is high and a top of the channel region is low.

14. The device as claimed in claim 10, wherein, in a cross-sectional view of the control gate electrode, both sidewalls of the first base pattern are covered with the floating gate pattern.

15. The device as claimed in claim 9, wherein the selection gate pattern comprises a lower selection gate pattern, an interlayer dielectric pattern, and an upper selection gate, which are sequentially stacked, wherein the lower selection gate pattern and the upper selection gate penetrate the interlayer dielectric layer to be connected to each other.

16. The device as claimed in claim 15, wherein, in a cross-sectional view of the selection gate, both sidewalls of the second base pattern are covered with the lower selection gate pattern.

\* \* \* \* \*